(12) United States Patent
Lee et al.

(10) Patent No.: US 11,257,884 B2
(45) Date of Patent: Feb. 22, 2022

(54) DISPLAY APPARATUS THAT PROTECTS INTERNAL ELEMENTS FROM EXTERNAL SHOCK

(71) Applicant: Samsung Display Co., Ltd., Yongin-Si (KR)

(72) Inventors: Seungrok Lee, Hwaseong-si (KR); Seulgi Kim, Busan (KR); Dohyun Kwon, Seongnam-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 16/822,391

(22) Filed: Mar. 18, 2020

(65) Prior Publication Data

US 2021/0066423 A1 Mar. 4, 2021

(30) Foreign Application Priority Data

Aug. 27, 2019 (KR) ........................ 10-2019-0104824

(51) Int. Cl.
*H01L 27/32* (2006.01)
*H01L 51/00* (2006.01)
(Continued)

(52) U.S. Cl.
CPC ........ *H01L 27/3258* (2013.01); *H01L 27/323* (2013.01); *H01L 27/3248* (2013.01); *H01L 51/0097* (2013.01); *H01L 51/5246* (2013.01); *H01L 51/5253* (2013.01); *H01L 51/56* (2013.01); *H01L 27/1248* (2013.01); *H01L 27/1288* (2013.01); *H01L 2227/323* (2013.01)

(58) Field of Classification Search
CPC ............. H01L 27/1248; H01L 27/1288; H01L 27/3258; H01L 27/323; H01L 27/3248; H01L 51/0097; H01L 51/5246; H01L 51/5253; H01L 51/56; H01L 2227/323
See application file for complete search history.

(56) References Cited

U.S. PATENT DOCUMENTS

2002/0057055 A1   5/2002  Yamazaki et al.
2004/0232418 A1  11/2004  Koyama et al.
(Continued)

FOREIGN PATENT DOCUMENTS

EP        3343617 A1    7/2018
KR      101482762 B1    1/2015
KR   1020180042504 A    4/2018

OTHER PUBLICATIONS

Extended European Search Report for Application No. 20178925. 2-1212 dated Nov. 18, 2020.

*Primary Examiner* — Matthew E Warren
(74) *Attorney, Agent, or Firm* — Cantor Colburn LLP

(57) ABSTRACT

A display apparatus includes a base substrate, a thin film transistor disposed on the base substrate and including an active pattern, a gate electrode, a source electrode, and a drain electrode, an inorganic insulating layer disposed between the active pattern and the gate electrode, a first organic insulating layer disposed on the thin film transistor, a second organic insulating layer disposed on the first organic insulating layer, and an insulating layer disposed between the first organic insulating layer and the second organic insulating layer and in direct contact with the first organic insulating layer and the second organic insulating layer.

17 Claims, 15 Drawing Sheets

(51) Int. Cl.
*H01L 51/52* (2006.01)
*H01L 51/56* (2006.01)
*H01L 27/12* (2006.01)

(56) References Cited

U.S. PATENT DOCUMENTS

| | | | |
|---|---|---|---|
| 2006/0091397 A1* | 5/2006 | Akimoto | H01L 27/3244 257/72 |
| 2015/0115229 A1* | 4/2015 | Jung | H01L 51/524 257/40 |
| 2015/0137131 A1* | 5/2015 | Kim | H01L 51/5253 257/72 |
| 2015/0212360 A1* | 7/2015 | Lee | G02F 1/133377 349/42 |
| 2018/0158890 A1 | 6/2018 | Chang et al. | |
| 2018/0337354 A1* | 11/2018 | Sonoda | H01L 27/3244 |
| 2018/0342564 A1 | 11/2018 | Hanari | |
| 2019/0019966 A1* | 1/2019 | Jiang | H01L 51/5253 |
| 2020/0183637 A1* | 6/2020 | Ahn | G10K 9/13 |
| 2020/0410909 A1* | 12/2020 | Jung | H01L 51/56 |

\* cited by examiner

DISPLAY APPARATUS THAT PROTECTS INTERNAL ELEMENTS FROM EXTERNAL SHOCK

This application claims priority to Korean Patent Application No. 10-2019-0104824, filed on Aug. 27, 2019, and all the benefits accruing therefrom under 35 U.S.C. § 119, the content of which in its entirety is herein incorporated by reference.

BACKGROUND

1. Field

Exemplary embodiments of the invention relate to a display apparatus and a method of manufacturing the display apparatus. More particularly, exemplary embodiments of the invention relate to a display apparatus that protects internal elements from external shock and a method of manufacturing the display apparatus.

2. Description of the Related Art

Recently, a display apparatus having a light weight and a small size has been manufactured. A cathode ray tube ("CRT") display apparatus has been previously used due to a high performance and a competitive price. However, the CRT display apparatus has a weakness with a size or portability. Therefore, a display apparatus such as a plasma display apparatus, a liquid crystal display apparatus and an organic light emitting display apparatus has been highly regarded due to having a small size, a light weight and a low-power-consumption.

SUMMARY

Recently, a flexible display apparatus capable of bending or folding a display apparatus itself has been developed. However, in a case of the flexible display apparatus, since a high-hardness protection window such as glass cannot be adopted, elements inside the display apparatus are easily damaged by external shocks, and therefore there is a need to compensate for such damages.

Exemplary embodiment of the invention provide a display apparatus that may protect internal elements from external shock.

Exemplary embodiments of the invention also provide a method of manufacturing the display apparatus that may protect internal elements from external shock.

An exemplary embodiment of the invention provides a display apparatus including a base substrate, a thin film transistor disposed on the base substrate and including an active pattern, a gate electrode, a source electrode, and a drain electrode, an inorganic insulating layer disposed between the active pattern and the gate electrode, a first organic insulating layer disposed on the thin film transistor, a second organic insulating layer disposed on the first organic insulating layer, and an insulating layer disposed between the first organic insulating layer and the second organic insulating layer and in direct contact with the first organic insulating layer and the second organic insulating layer.

In an exemplary embodiment, Young's modulus of the insulating layer may be equal to or greater than about 70 gigapascals (GPa).

In an exemplary embodiment, Young's modulus of the first organic insulating layer and the second organic insulating layer may be equal to or less than about 20 GPa.

In an exemplary embodiment, a contact hole exposing the source electrode or the drain electrode may be defined through the first organic insulating layer and the second organic insulating layer. An opening through which the contact hole passes may be defined in the insulating layer.

In an exemplary embodiment, the insulating layer may be disposed on an upper surface of the first organic insulating layer, and the insulating layer does not contact the source electrode or the drain electrode.

In an exemplary embodiment, the contact hole may include a first contact hole defined through the first organic insulating layer and a second contact hole defined through the second organic insulating layer. An edge of the first organic insulating layer defining the first contact hole may be spaced apart from the insulating layer by a first distance in a first direction. A width of the first contact hole may be greater than a width of the second contact hole.

In an exemplary embodiment, the display apparatus may further include a first electrode disposed on the second organic insulating layer and electrically connected to the source or drain electrode of the thin film transistor through the contact hole, a light emitting layer disposed on the first electrode, and a second electrode disposed on the light emitting layer.

In an exemplary embodiment, the display apparatus may further include a thin film encapsulation layer disposed on the second electrode, a touch electrode layer disposed on the thin film encapsulation layer, and a cover window disposed on the touch electrode layer and has flexibility. The base substrate may be flexible.

In an exemplary embodiment, the first organic insulating layer may include a siloxane-based resin. The second organic insulating layer may include a polyimide resin. The insulating layer may include silicon nitride (SiNx).

In an exemplary embodiment, the insulating layer may overlap the thin film transistor.

In an exemplary embodiment, the display apparatus may further include a third organic insulating layer disposed on the second organic insulating layer, and a second insulating layer disposed between the second organic insulating layer and the third organic insulating layer and in direct contact with the second organic insulating layer and the third organic insulating layer.

An exemplary embodiment of the invention provides a display apparatus including a base substrate, a thin film transistor disposed on the base substrate, and including an active pattern and a gate electrode, an electrode electrically connected to the thin film transistor, a gate insulating layer disposed between the active pattern of the thin film transistor and the gate electrode, a first insulating layer disposed on the thin film transistor and the electrode, a second insulating layer disposed on the first insulating layer, and an insulating layer disposed between the first insulating layer and the second insulating layer and in direct contact with the first insulating layer and the second insulating layer. Young's modulus of the insulating layer is equal to or greater than about 70 GPa.

In an exemplary embodiment, the gate insulating layer may include inorganic insulating material. The first insulating layer may include an organic insulating material. The second insulating layer may include an organic insulating material.

In an exemplary embodiment, the insulating layer may include silicon nitride (SiNx).

In an exemplary embodiment, a contact hole exposing the electrode through the first insulating layer and the second insulating layer may be defined. An opening through which the contact hole passes may be defined in the insulating layer.

In an exemplary embodiment, the display apparatus may further include a light emitting structure on the second insulating layer and electrically connected to the thin film transistor, a thin film encapsulation layer disposed on the light emitting structure, a touch electrode layer disposed on the thin film encapsulation layer, and a flexible cover window disposed on the touch electrode layer. The base substrate may be flexible.

An exemplary embodiment of the invention provides a method of manufacturing a display apparatus including forming a thin film transistor on a base substrate, an electrode electrically connected to the thin film transistor and a thin film transistor insulating layer, forming a first organic insulating layer on the thin film transistor and the thin film transistor insulating layer, defining a first contact hole exposing the electrode in the first organic insulating layer, forming an insulating layer on the first organic insulating layer in which the first contact hole is defined, defining an opening through the insulating layer to expose the first contact hole, forming a second organic insulating layer on the insulating layer and the first organic insulating layer in which the opening is defined, and defining a second contact hole exposing the electrode through the second organic insulating layer.

In an exemplary embodiment, the insulating layer may overlap the thin film transistor.

In an exemplary embodiment, the method may further include forming an additional insulating layer on the second organic insulating layer, and forming a third organic insulating layer on the additional insulating layer.

In an exemplary embodiment, in the defining the first contact hole, the first organic insulating layer may be exposed and developed using a first mask to define the first contact hole. The defining the opening may include forming a photoresist layer on the insulating layer, exposing and developing the photoresist layer using a second mask, and etching the insulating layer using the photoresist layer as an etch barrier to define the opening.

In the exemplary embodiments of the invention, the display apparatus has the insulating layer having a relatively large Young's modulus value between the first organic insulating layer and the second organic insulating layer, which are organic insulating layers. In the external impact, cracks are generated in the insulating layer before the inorganic insulating layers around the thin film transistors. In this case, the insulating layer has no portion in contact with the conductive pattern and only contacts the first organic insulating layer and the second organic insulating layer having a relatively small Young's modulus value. Propagation of the crack generated in the insulating layer may be blocked by the first organic insulating layer and the second organic insulating layer, and thus the external shock is dissipated.

As a result, damage or crack of the inorganic insulating layers around the thin film transistors which propagates to adjacent thin film transistors and the circuit wiring may be prevented. Therefore, problem of damage to the circuit may be prevented.

It is to be understood that both the foregoing general description and the following detailed description are exemplary and explanatory and are intended to provide further explanation of the invention as claimed.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
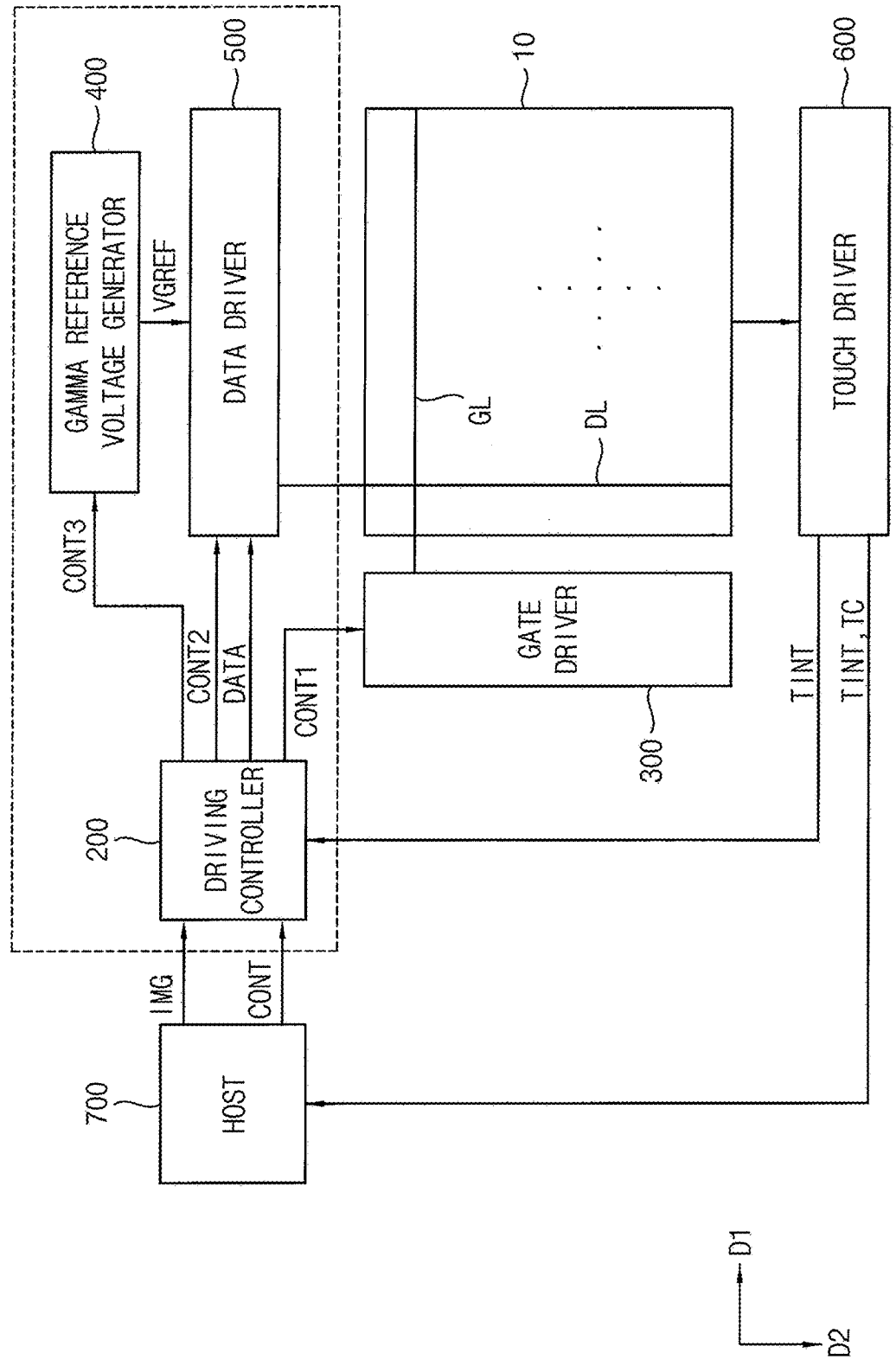
FIG. 1 is a block diagram illustrating an exemplary embodiment of a display apparatus according to the invention.

Hereinafter, the invention will be explained in detail with reference to the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a block diagram illustrating an exemplary embodiment of a display apparatus according to the invention.

Referring to FIG. 1, the display apparatus includes a display panel 10 and a display panel driver. The display panel driver includes a driving controller 200, a gate driver 300, a gamma reference voltage generator 400 and a data driver 500. The display apparatus may further include a touch driver 600. The display apparatus may further include a host 700.

In an exemplary embodiment, the driving controller 200 and the data driver 500 may be unitary. In an exemplary embodiment, the driving controller 200, the gamma reference voltage generator 400 and the data driver 500 may be unitary, for example.

The display panel 10 includes a display region and a peripheral region adjacent to the display region.

In an exemplary embodiment, the display panel 10 may be an organic light emitting diode display panel including organic light emitting diodes, for example.

The display panel 10 includes a plurality of gate lines GL, a plurality of data lines DL and a plurality of pixels electrically connected to the gate lines GL and the data lines DL. The gate lines GL extend in a first direction D1 and the data lines DL extend in a second direction D2 crossing the first direction D1.

In the illustrated exemplary embodiment, the display panel 10 may be a touch screen panel perceiving a touch event.

The driving controller 200 receives input image data IMG and an input control signal CONT from the host 700. In an exemplary embodiment, the input image data IMG may include red image data, green image data and blue image data, for example. In an exemplary embodiment, the input image data IMG may include white image data, for example. In an exemplary embodiment, the input image data IMG may include magenta image data, yellow image data and cyan image data, for example. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3 and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500. In the illustrated exemplary embodiment, the driving controller 200 may compensate the input image data IMG to generate the data signal DATA.

The driving controller 200 generates the third control signal CONT3 for controlling an operation of the gamma reference voltage generator 400 based on the input control signal CONT, and outputs the third control signal CONT3 to the gamma reference voltage generator 400.

The gate driver 300 generates gate signals driving the gate lines GL in response to the first control signal CONT1 received from the driving controller 200. The gate driver 300 outputs the gate signals to the gate lines GL. In an exemplary embodiment, the gate driver 300 may sequentially output the gate signals to the gate lines GL, for example.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to a level of the data signal DATA.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

The touch driver 600 may determine a touch event of the display panel 10. The touch driver 600 may generate a touch interrupt signal TINT representing an occurrence of the touch event and a touch coordinate signal TC representing coordinates of a touch position. The touch driver 600 may output the touch interrupt signal TINT and the touch coordinate signal TC to the host 700. In addition, the touch driver 600 may output the touch interrupt signal TINT to the driving controller 200. Thus, in the illustrated exemplary embodiment, the driving controller 200 may include an input port receiving the touch interrupt signal TINT from the touch driver 600, for example.

The host 700 outputs the input image data IMG and the input control signal CONT to the driving controller 200.

The host 700 may receive the touch interrupt signal TINT and the touch coordinate signal TC from the touch driver 600. The host 700 may change the input image data IMG to change a display image of the display panel 10 in response to the touch interrupt signal TINT and the touch coordinate signal TC.

Figure 2:
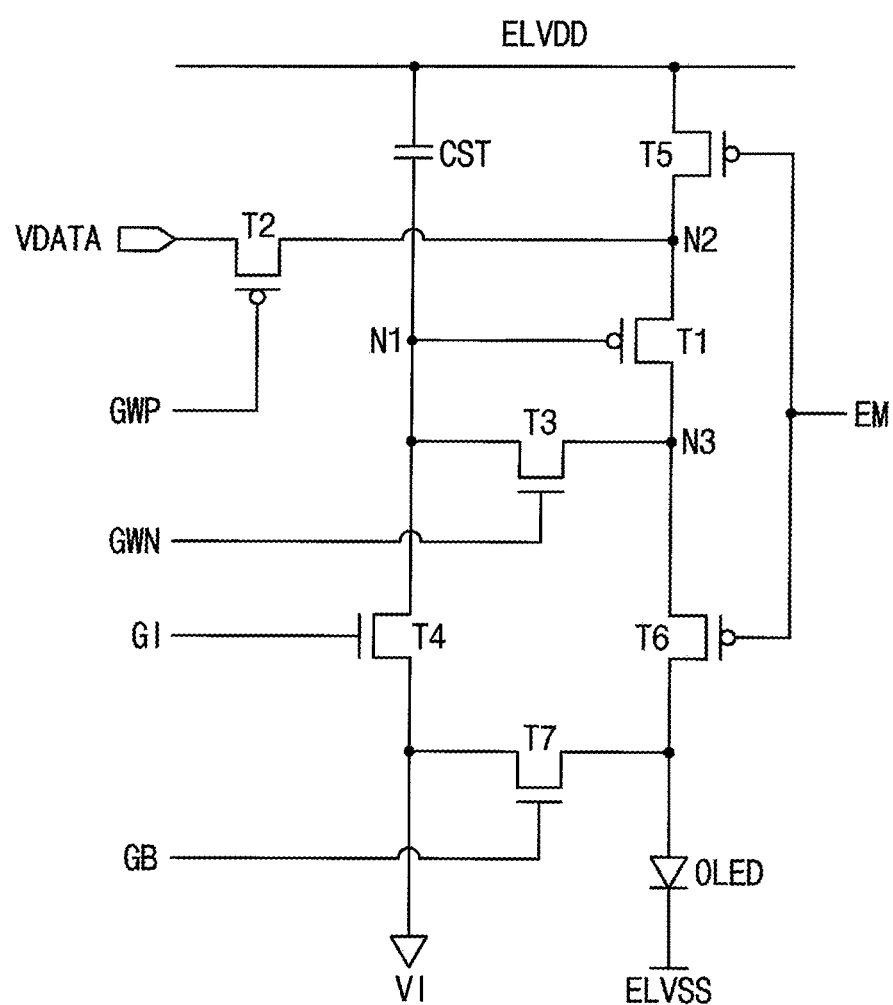
FIG. 2 is a circuit diagram illustrating pixels of a display panel of FIG. 1.

FIG. 2 is a circuit diagram illustrating pixels of a display panel of FIG. 1.

Referring to FIG. 2, the display panel 10 includes a plurality of pixels, and each of the pixels includes an organic light emitting diode OLED.

The pixel receives a data write gate signal GWP and GWN, a data initialization gate signal GI, an organic light emitting element initialization signal GB, the data voltage VDATA and the emission signal EM and the organic light emitting element OLED of the pixel emits light corresponding to the level of the data voltage VDATA to display the image.

In the illustrated exemplary embodiment, the pixel may include a switching element of a first type and a switching element of a second type different from the first type. In an exemplary embodiment, the switching element of the first type may be a polysilicon thin film transistor, for example. In an exemplary embodiment, the switching element of the first type may be a low temperature polysilicon ("LTPS") thin film transistor, for example. In an exemplary embodiment, the switching element of the second type may be an oxide thin film transistor, for example. In an exemplary embodiment, the switching element of the first type may be a P-type transistor and the switching element of the second type may be an N-type transistor, for example.

In an exemplary embodiment, the data write gate signal may include a first data write gate signal GWP and a second data write gate signal GWN, for example. The first data write gate signal GWP may be applied to the P-type transistor so that the first data write gate signal GWP has an activation signal of a low level corresponding to a data writing timing. The second data write gate signal GWN may be applied to the N-type transistor so that the second data write gate signal GWN has an activation signal of a high level corresponding to the data writing timing.

At least one of the pixels may include first to seventh pixel switching elements T1 to T7, a storage capacitor CST and the organic light emitting element OLED.

The first pixel switching element T1 includes a control electrode connected to a first node N1, an input electrode connected to a second node N2 and an output electrode connected to a third node N3. In an exemplary embodiment, the first pixel switching element T1 may be the polysilicon thin film transistor, for example. In an exemplary embodiment, the first pixel switching element T1 may be the P-type thin film transistor, for example.

The second pixel switching element T2 includes a control electrode to which the first data write gate signal GWP is applied, an input electrode to which the data voltage VDATA is applied and an output electrode connected to the second node N2. In an exemplary embodiment, the second pixel switching element T2 may be the polysilicon thin film transistor, for example. In an exemplary embodiment, the second pixel switching element T2 may be the P-type thin film transistor, for example.

The third pixel switching element T3 includes a control electrode to which the second data write gate signal GWN is applied, an input electrode connected to the first node N1 and an output electrode connected to the third node N3. In an exemplary embodiment, the third pixel switching element T3 may be the oxide thin film transistor, for example. In an exemplary embodiment, the third pixel switching element T3 may be the N-type thin film transistor, for example.

The fourth pixel switching element T4 includes a control electrode to which the data initialization gate signal GI is applied, an input electrode to which an initialization voltage VI is applied and an output electrode connected to the first node N1. In an exemplary embodiment, the fourth pixel switching element T4 may be the oxide thin film transistor, for example. In an exemplary embodiment, the fourth pixel switching element T4 may be the N-type thin film transistor, for example.

The fifth pixel switching element T5 includes a control electrode to which the emission signal EM is applied, an input electrode to which a high power voltage ELVDD is applied and an output electrode connected to the second node N2. In an exemplary embodiment, the fifth pixel switching element T5 may be the polysilicon thin film transistor, for example. In an exemplary embodiment, the fifth pixel switching element T5 may be the P-type thin film transistor, for example.

The sixth pixel switching element T6 includes a control electrode to which the emission signal EM is applied, an input electrode connected to the third node N3 and an output electrode connected to an anode electrode of the organic light emitting element OLED. In an exemplary embodiment, the sixth pixel switching element T6 may be the polysilicon thin film transistor, for example. In an exemplary embodiment, the sixth pixel switching element T6 may be a P-type thin film transistor, for example.

The seventh pixel switching element T7 includes a control electrode to which the organic light emitting element initialization gate signal GB is applied, an input electrode to which the initialization voltage VI is applied and an output electrode connected to the anode electrode of the organic light emitting element OLED. In an exemplary embodiment, the seventh pixel switching element T7 may be the oxide thin film transistor, for example. In an exemplary embodiment, the seventh pixel switching element T7 may be the N-type thin film transistor, for example. In an alternative exemplary embodiment, the seventh pixel switching element T7 may be the polysilicon thin film transistor. In an exemplary embodiment, the seventh pixel switching element T7 may be a P-type thin film transistor. When the seventh pixel switching element T7 is the P-type thin film transistor, the organic light emitting element initialization gate signal GB may have an activation signal of a low level, for example.

The storage capacitor CST includes a first electrode to which the high power voltage ELVDD is applied and a second electrode connected to the first node N1.

The organic light emitting element OLED includes the anode electrode and a cathode electrode to which a low power voltage ELVSS is applied.

Figure 3:
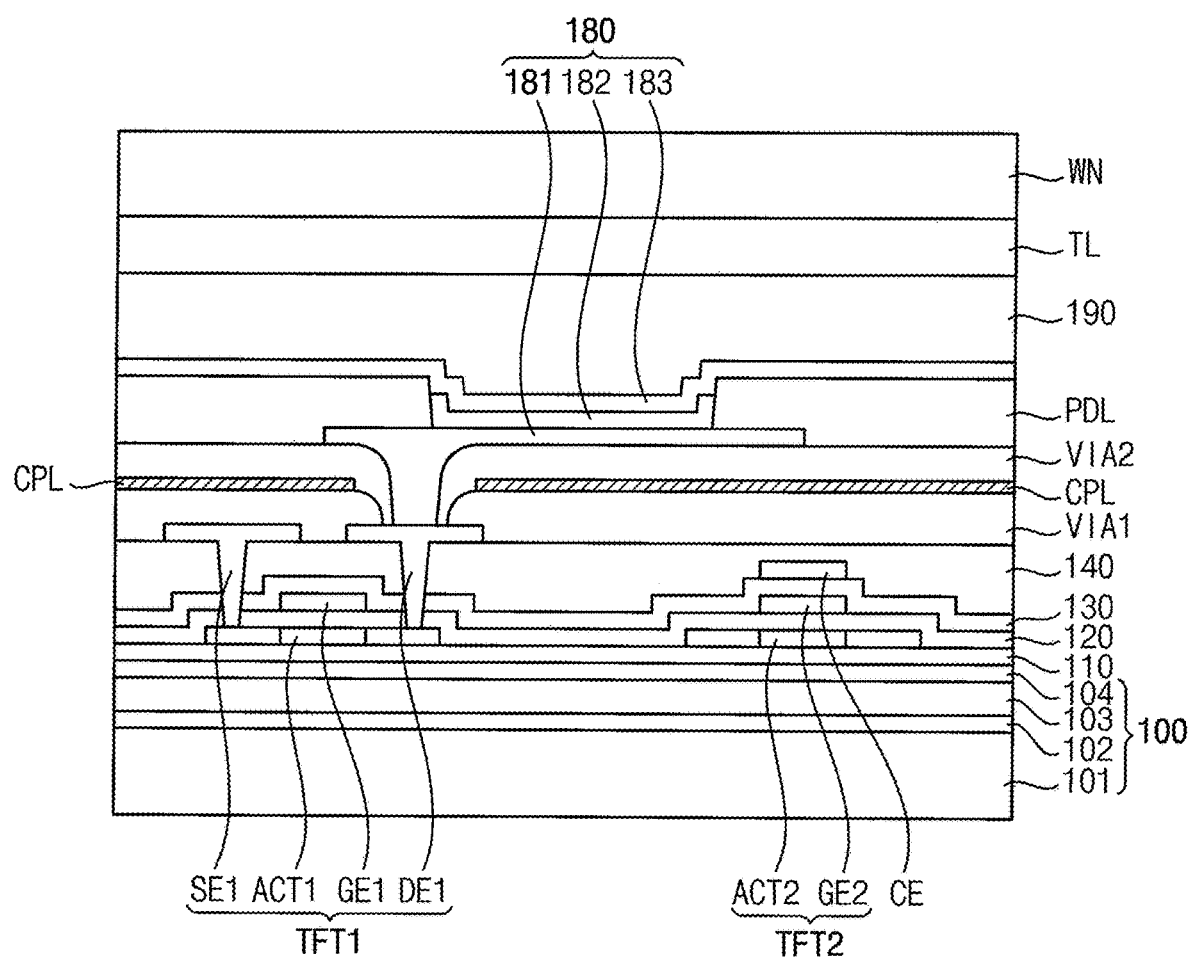
FIG. 3 is a cross-sectional view of an exemplary embodiment of a display apparatus according to the invention.
Figure 4A:
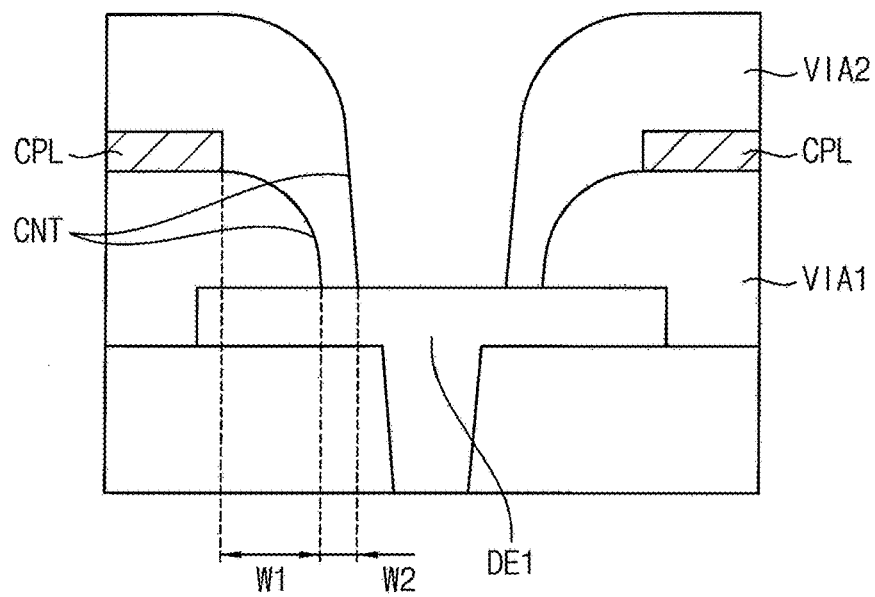
FIG. 4A is a partially enlarged cross-sectional view illustrating in detail surrounding a contact hole of the display apparatus of FIG. 3.
Figure 4B:
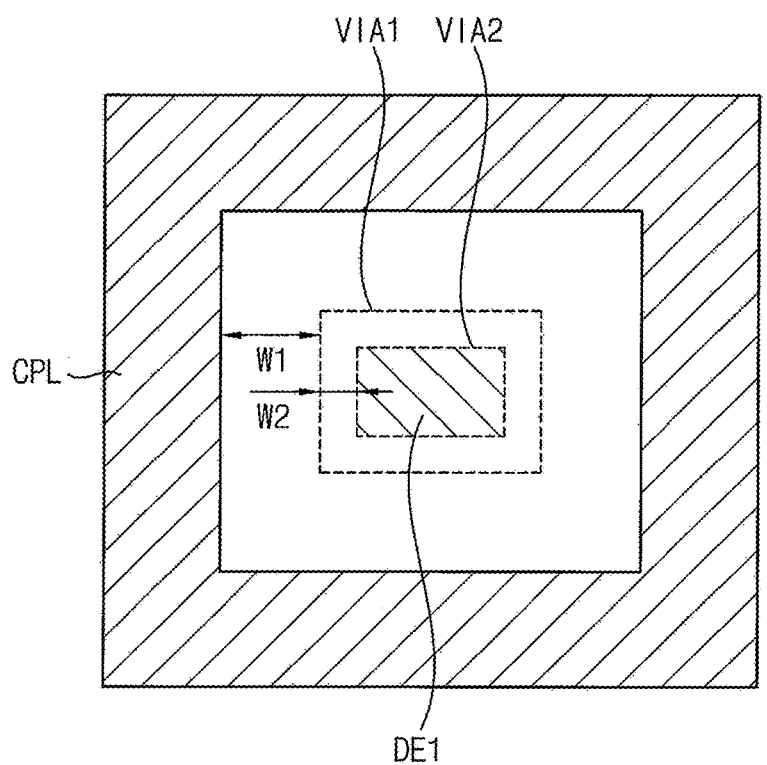
FIG. 4B is a plan view illustrating a contact hole of FIG. 4A.

FIG. 3 is a cross-sectional view of an exemplary embodiment of a display apparatus according to the invention. FIG. 4A is a partially enlarged cross-sectional view illustrating in detail surrounding a contact hole of the display apparatus of FIG. 3. FIG. 4B is a plan view illustrating a contact hole of FIG. 4A.

Referring to FIGS. 3 to 4B, the display apparatus includes a base substrate 100, a buffer layer 110, an active pattern layer, a first insulating layer 120, a first gate conductive pattern, and a second insulating layer 130, a second gate conductive pattern, a third insulating layer 140, a first source drain conductive pattern, a first organic insulating layer VIA1, an insulating layer CPL, a second organic insulating layer VIA2, and a pixel defining layer PDL, a light emitting structure 180, a thin film encapsulation layer 190, a touch electrode layer TL, and a cover window WN.

The base substrate 100 including transparent or opaque insulation materials may be provided. The base substrate 100 may include a flexible transparent material such as a flexible transparent resin substrate (e.g., a polyimide substrate). In this case, the polyimide substrate may include a first polyimide layer 101, a first barrier film layer 102 disposed on the first polyimide layer 101, a second polyimide layer 103 disposed on the barrier film layer 102, and a second barrier film layer 104 disposed on the second polyimide layer 103.

The buffer layer 110 may be disposed on the entire base substrate 100. The buffer layer 110 may prevent the diffusion of metal atoms and/or impurities from the base substrate 100 into the active pattern ACT. In addition, the buffer layer 110 may control a rate of a heat transfer in a crystallization process for forming the active pattern ACT, thereby obtaining substantially uniform the active pattern ACT. In addition, the buffer layer 110 may improve flatness of a surface of the base substrate 100 when the surface of the base substrate 100 is not uniform.

The active pattern layer may be disposed on the buffer layer 110. The active pattern layer may include poly crystal silicon. In exemplary embodiments, the active pattern layer may include an oxide semiconductor.

The active pattern layer may include a first active pattern ACT1 and a second active pattern ACT2. The first active pattern ACT1 may include a drain region and a source region doped with impurities and a channel region between the drain region and the source region. The second active pattern ACT2 may include a drain region and a source region doped with impurities and a channel region between the drain region and the source region.

The first insulating layer 120 may be disposed on the buffer layer 110 on which the active pattern layer is disposed. The first insulating layer 120 may include silicon compound, metal oxide, etc. In an exemplary embodiment, the first insulating layer 120 may include at least one of silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc., for example. The first insulating layer 120 may include a plurality of layers.

The first gate conductive pattern may be disposed on the first insulating layer 120. The first gate conductive pattern may include a first gate electrode GE1 and a second gate electrode GE2. The first gate electrode GE1 may be disposed to overlap the first active pattern ACT1. The second gate electrode GE2 may be disposed to overlap the second active pattern ACT2. The first gate conductive pattern may be provided using a metal, an alloy, a metal nitride, a conductive metal oxide, a transparent conductive material, or the like.

The second insulating layer 130 may be disposed on the first insulating layer 120 on which the first gate conductive pattern is disposed. The second insulating layer 130 may include silicon compound, metal oxide, etc. In an exemplary embodiment, the second insulating layer 130 may include at least one of silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc., for example. The second insulating layer 130 may include a plurality of layers.

The second gate conductive pattern may be disposed on the second insulating layer 130. The second gate conductive pattern may include a storage electrode CE. The storage electrode CE may overlap the second gate electrode GE2 to form a storage capacitor with an insulating layer therebetween. The second gate conductive pattern may be provided using a metal, an alloy, a metal nitride, a conductive metal oxide, a transparent conductive material, or the like.

The third insulating layer 140 may be disposed on the second insulating layer 130 on which the second gate conductive pattern is disposed. The third insulating layer 140 may include an inorganic insulating material or an organic insulating material.

The first source drain conductive pattern may be disposed on the third insulating layer 140. The first source drain conductive pattern may include a first source electrode SE1 and a first drain electrode DE1. The first source electrode SE1 may be electrically connected to the first active pattern ACT1 through contact holes defined through the third insulating layer 140, the second insulating layer 130, and the first insulating layer 120. The first drain electrode DE1 may be electrically connected to the first active pattern ACT1 through a contact hole defined through the third insulating layer 140, the second insulating layer 130, and the first insulating layer 120. The first source drain conductive pattern may be provided using a metal, an alloy, a metal nitride, a conductive metal oxide, a transparent conductive material, or the like.

The first active pattern ACT1, the first gate electrode GE1, the first source electrode SE1, and the first drain electrode DE1 may be included in a first thin film transistor TFT1.

The second active pattern ACT2 and the second gate electrode GE2 may be included in a second thin film transistor TFT2.

The first and second thin film transistors TFT1 and TFT2 may be any one of pixel switching elements constituting the pixel described with reference to FIG. 2.

The first organic insulating layer VIA1 may be disposed on the third insulating layer 140 on which the first source drain conductive pattern is disposed. The first organic insulating layer VIA1 may have a single-layered structure or a multi-layered structure including at least two insulation films. The first organic insulating layer VIA1 may be provided using an organic material. In an exemplary embodiment, the first organic insulating layer VIA1 may include photoresist, acryl-based resin, polyimide-based resin, polyamide-based resin, siloxane-based resin, etc., for example.

In this case, Young's modulus of the first organic insulating layer VIA1 may be equal to or less than 20 GPa. In an exemplary embodiment, the first organic insulating layer VIA1 may include a siloxane-based resin and may have a Young's modulus value of about 7.5 GPa, for example.

The insulating layer CPL may be disposed on the first organic insulating layer VIA1. The insulating layer CPL may directly contact the first organic insulating layer VIA1 and the second organic insulating layer VIA2.

Here, a contact hole CNT exposing the first drain electrode DE1 may be defined through the first organic insulating layer VIA1 and the second organic insulating layer VIA2.

An opening through which the contact hole CNT passes may be defined in the insulating layer CPL. An inclined side surface of the first organic insulating layer VIA1 and the second organic insulating layer VIA2 is disposed in the contact hole, and the insulating layer CPL is disposed on an upper surface of the first organic insulating layer VIA1, so that the insulating layer CPL may not be in contact with the first drain electrode DE1.

The insulating layer CPL may include inorganic material. In an exemplary embodiment, the insulating layer CPL may include at least one of silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc., for example.

Young's modulus of the insulating layer CPL may be equal to or greater than 70 Gpa. As the Young's modulus of the insulating layer CPL increases, it is advantageous to prevent crack propagation. Preferably, the Young's modulus of the insulating layer CPL may be equal to or greater than 150 Gpa. In an exemplary embodiment, the insulating layer CPL may include silicon nitride SiNx and may have a Young's modulus value of about 151.7 GPa, for example. When the insulating layer CPL includes the silicon nitride SiNx, a thickness of the insulating layer CPL may be about 1000 angstroms (Å) to about 7000 Å. In an exemplary embodiment, the thickness of the insulating layer CPL may be about 2000 Å, for example.

The crack preventing insulating layer CPL may overlap the first and second thin film transistors TFT1 and TFT2.

The second organic insulating layer VIA2 may be disposed on the first organic insulating layer VIA1 on which the crack preventing insulating layer CPL is disposed.

The second organic insulating layer VIA2 may have a single-layered structure or a multi-layered structure including at least two insulation films. The second organic insulating layer VIA2 may be provided using an organic material. In an exemplary embodiment, the second organic insulating layer VIA2 may include photoresist, acryl-based resin, polyimide-based resin, polyamide-based resin, siloxane-based resin, etc., for example.

In this case, the Young's modulus of the second organic insulating layer VIA2 may be equal to or less than 20 GPa. In an exemplary embodiment, the second organic insulating layer VIA2 may include a polyimide resin and have a Young's modulus value of about 10 GPa, for example.

The contact hole exposing the first drain electrode DE1 may be defined through the first organic insulating layer VIA1, the opening of the insulating layer CPL, and the second organic insulating layer VIA2.

In this case, thickness of the first organic insulating layer VIA1 and the second organic insulating layer VIA2 may be greater than a thickness of the insulating layer CPL. In an exemplary embodiment, the thickness of the first organic insulating layer VIA1 and the second organic insulating layer VIA2 may be about 1 micrometer (μm) to about 2 μm, for example. In an exemplary embodiment, the thickness of the first organic insulating layer VIA1 is about 1.4 um, the thickness of the second organic insulating layer VIA2 is about 1.6 um, and thickness of the insulating layer CPL is about 2000 Å, for example.

The contact hole CNT may include a first contact hole defined in the first organic insulating layer VIA1 and a second contact hole defined in the second organic insulating layer VIA2.

An edge of a lower surface of the first organic insulating layer VIA1 defining the first contact hole is spaced apart from the insulating layer CPL by a first distance w1 in a first direction (e.g., horizontal direction in FIG. 4A). A width of the first contact hole is greater than a width of the second contact hole. An edge of a lower surface of the second organic insulating layer VIA2 defining the second contact hole may be spaced apart from the edge of the first organic insulating layer VIA1 by a second distance w2 in the first direction on the first drain electrode DE1 (referring to FIGS. 4A and 4B). In this case, the first distance w1 may be equal to or greater than about 1 μm, for example, the first distance w1 may be about 2 μm.

The light emitting structure 180 may include a first electrode 181, a light emitting layer 182 and a second electrode 183.

The first electrode 181 may be disposed on the second organic insulating layer VIA2. The first electrode 181 may include a reflective material or a transmissive material in accordance with the emission type of the display apparatus. In exemplary embodiments, the first electrode 181 may have a single layer structure or a multi-layer structure, which may include a metal film, an alloy film, a metal nitride film, a conductive metal oxide film and/or a transparent conductive film.

The pixel defining layer PDL may be disposed on the second organic insulating layer VIA2 on which the first electrode 181 is disposed. The pixel defining layer PDL may be provided using an organic material. In an exemplary embodiment, the pixel defining layer PDL may include photoresist, acryl-based resin, polyimide-based resin, polyamide-based resin, siloxane-based resin, etc., for example. In some exemplary embodiments, an opening which exposes the first electrode 181 may be defined by etching the pixel defining layer PDL. An emitting area and a non-emitting area of the display apparatus may be defined by the opening of the pixel defining layer PDL. In an exemplary embodiment, a portion where the opening of the pixel defining layer PDL is defined may correspond to an emitting area, and a non-emitting area may correspond to a portion adjacent to the opening of the pixel defining layer PDL, for example.

The light emitting layer 182 may be disposed on the first electrode 181 exposed through the opening of the pixel defining layer PDL. In addition, the light emitting layer 182 may extend on a sidewall of the opening of the pixel defining layer PDL. In some exemplary embodiments, the light emitting layer 182 may include at least one of an organic light emitting layer ("EL"), a hole injection layer ("HIL"), a hole transfer layer ("HTL"), an electron transfer layer ("ETL"), an electron injection layer ("EIL"), etc. In some exemplary embodiments, except for the organic emission layer, the HIL, the hole transport layer, the electron transport layer, and the EIL may be disposed in common to correspond to a plurality of pixels. In some exemplary embodiments, a plurality of ELs may be provided using light emitting materials for generating different colors of light such as a red color of light, a green color of light and a blue color of light in accordance with color pixels of the display device. In some exemplary embodiments, the EL of the of the light emitting layer 182 may include a plurality of stacked light emitting materials for generating a red color of light, a green color of light and a blue color of light to thereby emitting a white color of light, for example. Here, elements of the light emitting layer 182 are commonly provided so as to correspond to a plurality of pixels, and each pixel may be divided by a color filter layer.

The second electrode 183 may be disposed on the pixel defining layer PDL and the light emitting layer 182. The second electrode 183 may include a transmissive material or a reflective material in accordance with the emission type of the display device. In exemplary embodiments, the second electrode 183 may also have a single layer structure or a multi-layer structure, which may include a metal film, an alloy film, a metal nitride film, a conductive metal oxide film and/or a transparent conductive film.

The thin film encapsulation layer 190 may be disposed on the second electrode 183. The thin film encapsulation layer 190 may prevent penetration of moisture and oxygen from outside. The thin film encapsulation layer 190 may include at least one organic layer and at least one inorganic layer. The at least one organic layer and the at least one inorganic layer may be alternately stacked with each other. In an exemplary embodiment, the thin film encapsulation layer 190 may include two inorganic layers and one organic layer therebetween, but is not limited thereto, for example.

The touch electrode layer TL may be disposed on the thin film encapsulation layer 190. The touch electrode layer TL may include a touch electrode for sensing a user's touch input.

The cover window WN may be disposed on the touch electrode layer TL. The cover window WN is an external protective layer for protecting internal elements of the display apparatus. When the display apparatus is a flexible display apparatus, the cover window WN may be a flexible cover window.

Although not shown, an optical element such as a color filter or a polarizing plate may be further disposed below the cover window WN.

According to the illustrated exemplary embodiment, the display apparatus includes the insulating layer CPL having a relatively large Young's modulus value between the first organic insulating layer VIA1 and the second organic insulating layer VIA2, which are organic insulating layers. In the external impact, cracks are generated in the insulating layer CPL before the inorganic insulating layers around the first and second thin film transistors TFT1 and TFT2. In this case, the insulating layer CPL has no portion in contact with the conductive pattern and only contacts the first organic insulating layer VIA1 and the second organic insulating layer VIA2 having a relatively small Young's modulus value. Propagation of the crack generated in the insulating layer CPL may be blocked by the first organic insulating layer VIA1 and the second organic insulating layer VIA2, and thus the external shock is dissipated.

As a result, damage or crack of the inorganic insulating layers around the first and second thin film transistors TFT1 and TFT2 which propagates to adjacent thin film transistors and the circuit wiring may be prevented. Therefore, problem of damage to the circuit may be prevented.

Figure 5:
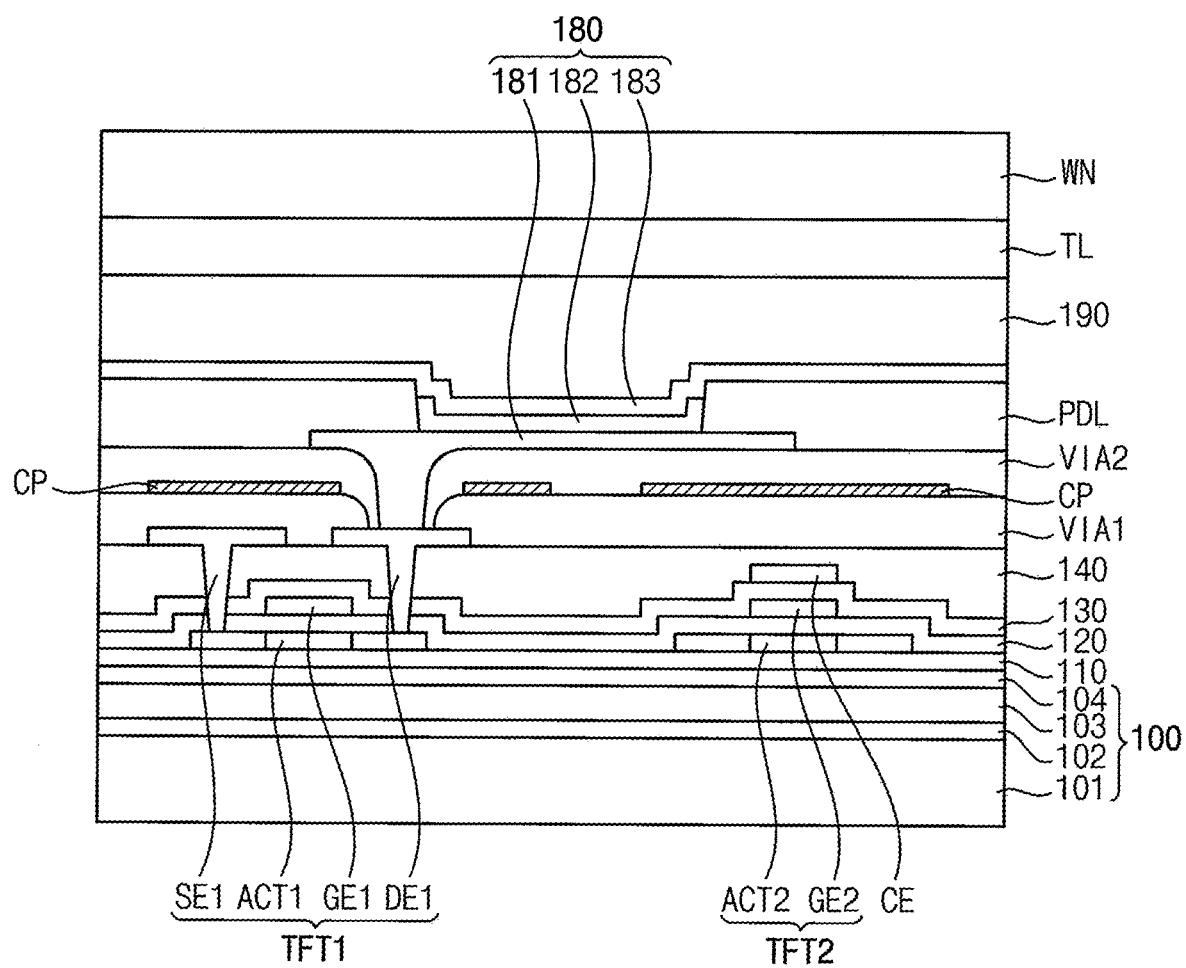
FIG. 5 is a cross-sectional view of an exemplary embodiment of a display apparatus according to the invention.

FIG. 5 is a cross-sectional view of an exemplary embodiment of a display apparatus according to the invention.

Referring to FIG. 5, the display apparatus is substantially the same as the display apparatus of FIG. 3 except for an insulating pattern CP. Therefore, repeated description is omitted.

The insulating pattern CP may be patterned in a specific form unlike in the exemplary embodiment of FIG. 3. The insulating pattern CP may surround the contact hole and has a portion spaced apart from a portion overlapping the first thin film transistor TFT1. Accordingly, the first and second thin film transistors TFT1 and TFT2 may be protected from external shock.

Figure 6:
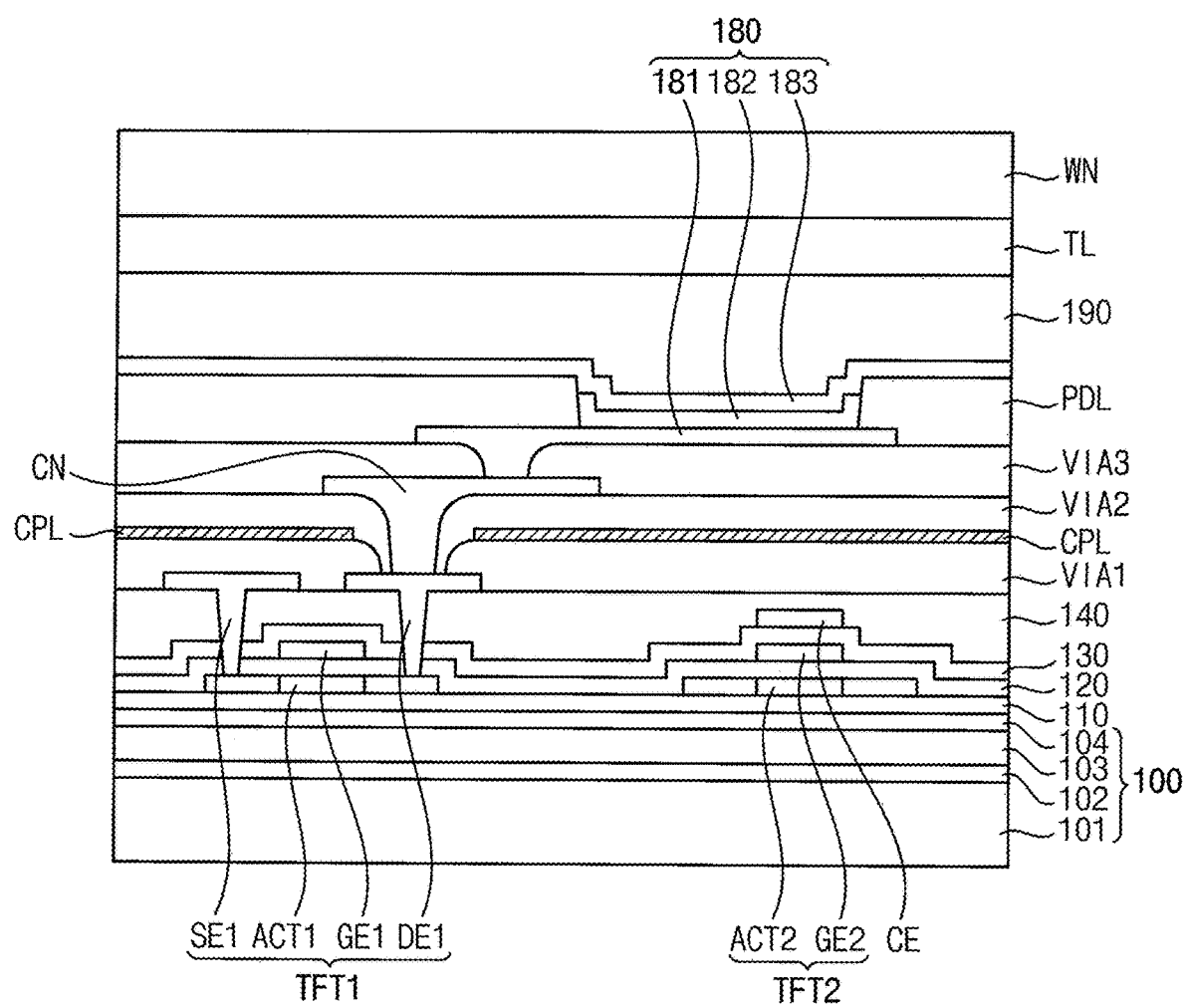
FIG. 6 is a cross-sectional view of an exemplary embodiment of a display apparatus according to the invention.

FIG. 6 is a cross-sectional view of an exemplary embodiment of a display apparatus according to the invention.

Referring to FIG. 6, the display apparatus is substantially the same as the display apparatus of FIG. 3 except for a third organic insulating layer VIA3 and a second source drain conductive pattern. Therefore, repeated description will be omitted.

The third organic insulating layer VIA3 may be disposed on the second organic insulating layer VIA2. The third organic insulating layer VIA3 may have a single-layered structure or a multi-layered structure including at least two insulation films. The third organic insulating layer VIA3 may be provided using an organic material. In an exemplary embodiment, the third organic insulating layer VIA3 may include at least one of photoresist, acryl-based resin, polyimide-based resin, polyamide-based resin, siloxane-based resin, etc., for example.

The second source drain conductive pattern may be disposed on the third organic insulating layer VIA3. The second source drain conductive pattern may be disposed on the third organic insulating layer VIA3. The second source drain conductive pattern may include a connection electrode CN. The connection electrode CN may be electrically connected to the first drain electrode DE1 through a contact hole exposing the first drain electrode DE1 of the first thin film transistor TFT1 through the second organic insulating layer VIA2, the opening of the insulating layer CPL, and the first organic insulating layer VIA1. The second source drain conductive pattern may be provided using a metal, an alloy, a metal nitride, a conductive metal oxide, a transparent conductive material, or the like.

Figure 7:
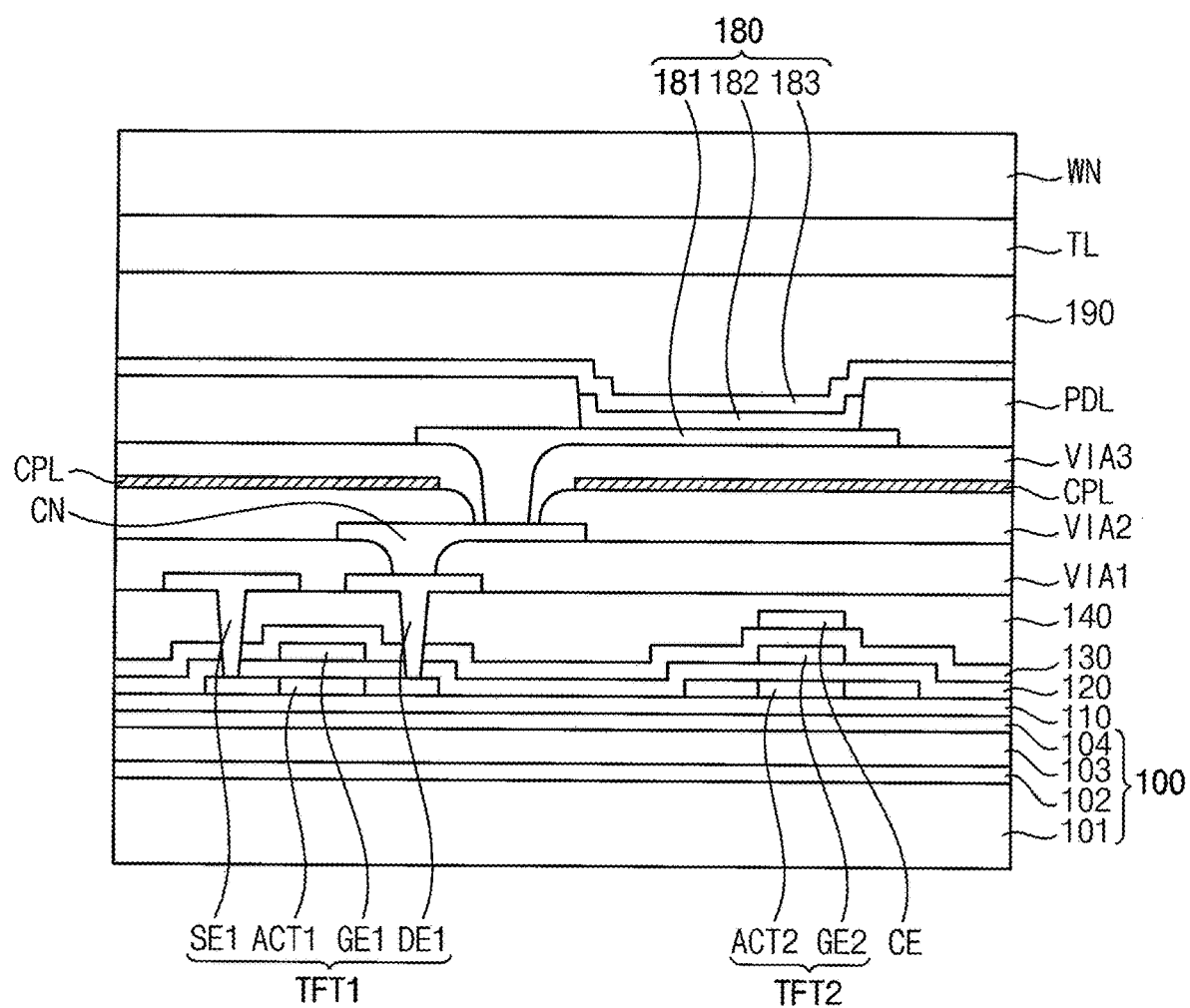
FIG. 7 is a cross-sectional view of an exemplary embodiment of a display apparatus according to the invention.

FIG. 7 is a cross-sectional view of an exemplary embodiment of a display apparatus according to the invention.

Referring to FIG. 7, the display apparatus is substantially the same as the display apparatus of FIG. 3, except that an insulating layer CPL is disposed between a second organic insulating layer VIA2 and a third organic insulating layer VIA3, and a shape of a contact hole. Therefore, repeated description is omitted.

Figure 8:
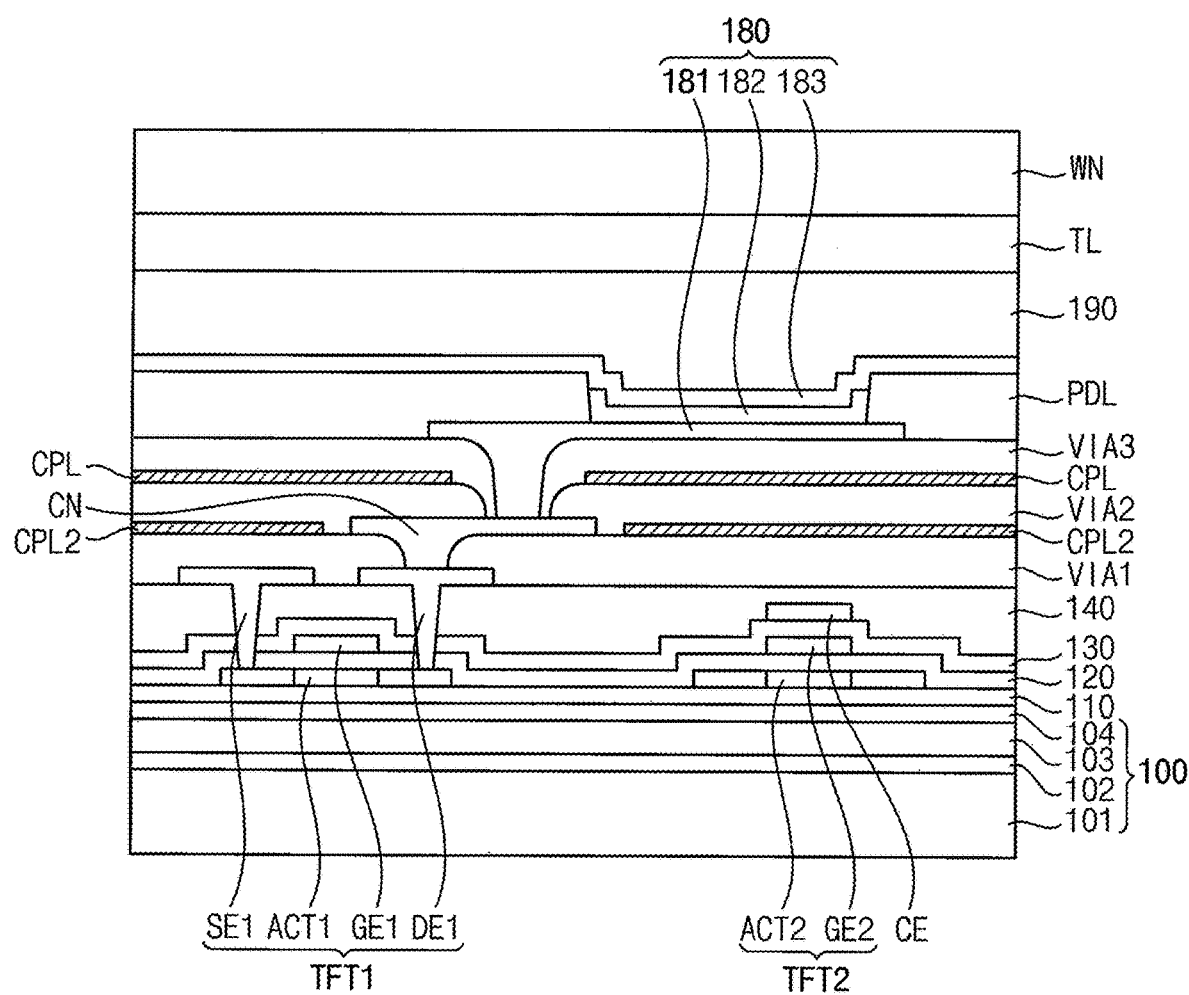
FIG. 8 is a cross-sectional view of an exemplary embodiment of a display apparatus according to the invention.

FIG. 8 is a cross-sectional view of an exemplary embodiment of a display apparatus according to the invention.

Referring to FIG. 8, the display apparatus is substantially the same as the display apparatus of FIG. 7 except that the display apparatus further includes an additional insulating layer CPL2. Therefore, repeated description is omitted.

The additional insulating layer CPL2 may be disposed between a first organic insulating layer VIA1 and a second organic insulating layer VIA2. That is, the display apparatus may include an insulating layer CPL disposed between the second organic insulating layer VIA2 and a third organic insulating layer VIA3, and the additional insulating layer CPL2 disposed between the first organic insulating layer VIA1 and the second organic insulating layer VIA2. In this case, since the display apparatus has a structure in which the insulating layer is provided in two layers, it is possible to more effectively prevent the external shock from being transmitted to the thin film transistor and the circuit wiring.

FIGS. 9A to 9H are cross-sectional views illustrating a method of manufacturing the display apparatus of FIG. 3.

Figure 9A:
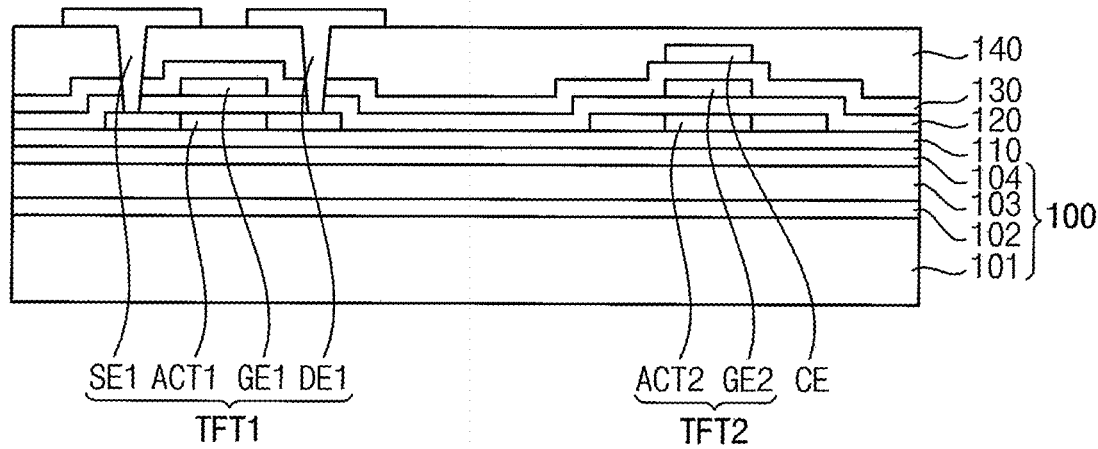
FIGS. 9A to 9H are cross-sectional views illustrating a method of manufacturing the display apparatus of FIG. 3.

Referring to FIG. 9A, thin film transistors TFT1 and TFT2, electrodes DE1 and DE2 electrically connected to the thin film transistors, and thin film transistor insulating layers 110, 120, 130 and 140 may be disposed on the base substrate 100.

Specifically, a buffer layer 110 may be disposed on the base substrate 100 including a first polyimide layer 101, a first barrier layer 102, a second polyimide layer 103 and a second barrier layer 104. An active pattern layer including a first active pattern ACT1 and a second active pattern ACT2 may be disposed on the buffer layer 110.

A first insulating layer 120 may be disposed on the active pattern layer. A first gate conductive pattern including a first gate electrode GE1 and a second gate electrode GE2 may be disposed on the first insulating layer 120. A second insulating layer 130 may be disposed on the first insulating layer 120 on which the first gate conductive pattern is disposed. A second gate conductive pattern including the storage electrode CE may be disposed on the second insulating layer 130. A third insulating layer 140 may be disposed on the second insulating layer 130 on which the second gate conductive pattern is disposed. A contact hole exposing the first active pattern ACT1 may be defined through the third insulating layer 140, the second insulating layer 130, and the first insulating layer 120. A first source drain conductive pattern including a first source electrode SE1 and a first drain electrode DE1 electrically connected to the first active pattern ACT1 through the contact hole may be disposed on the first insulating layer 120.

Figure 9B:
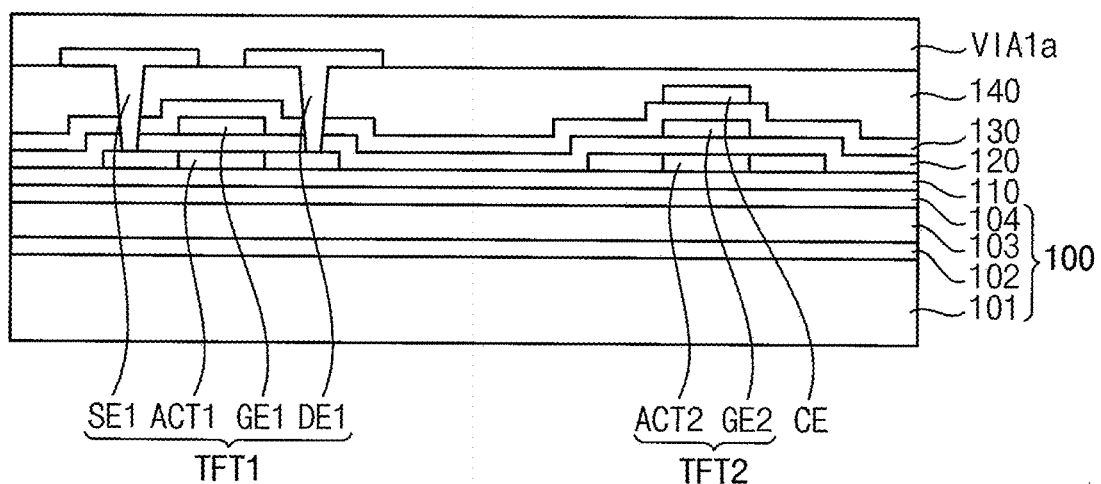

Referring to FIG. 9B, a first organic insulating layer VIA1a may be disposed on the first and second thin film transistors TFT1 and TFT2 and the thin film transistor insulating layers 110, 120, 130, and 140.

Specifically, the first organic insulating layer VIA1a including photoresist composition may be disposed on the third insulating layer 140. In an exemplary embodiment, the first organic insulating layer VIA1a may be provided using a spin coating process or the like, for example.

Figure 9C:
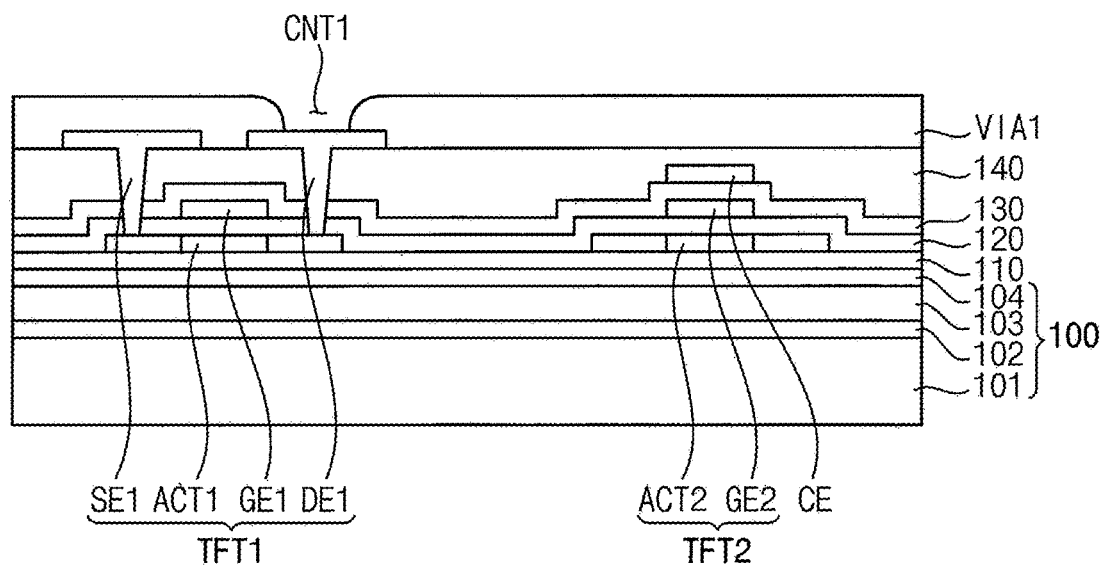

Referring to FIG. 9C, a first contact hole CNT1 exposing the electrode DE1 may be defined in the first organic insulating layer VIA1.

In detail, the first organic insulating layer VIA1a including the photoresist composition is exposed and developed by a first mask to form the first organic insulating layer through which the first contact hole CNT1 is defined are provided.

Figure 9D:
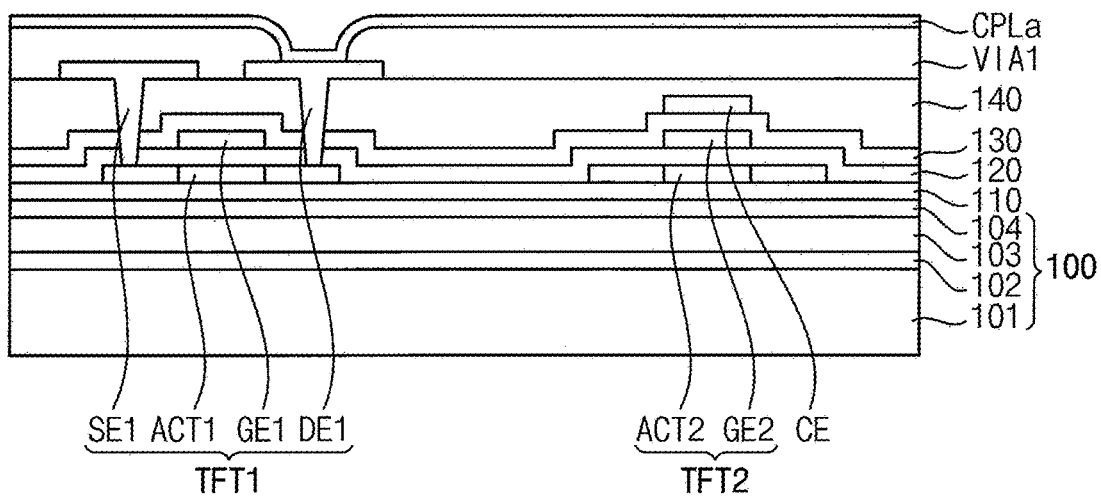

Referring to FIG. 9D, an insulating layer CPLa may be disposed on the first organic insulating layer VIA1 in which the first contact hole CNT1 is defined.

In detail, an insulating layer CPLa including an inorganic insulating material may be disposed on the first organic insulating layer VIA1.

Specifically, an insulating layer CPLa including an inorganic insulating material may be disposed on the first organic insulating layer VIA1. The insulating layer CPLa may be provided using a chemical vapor deposition process or the like.

Figure 9E:
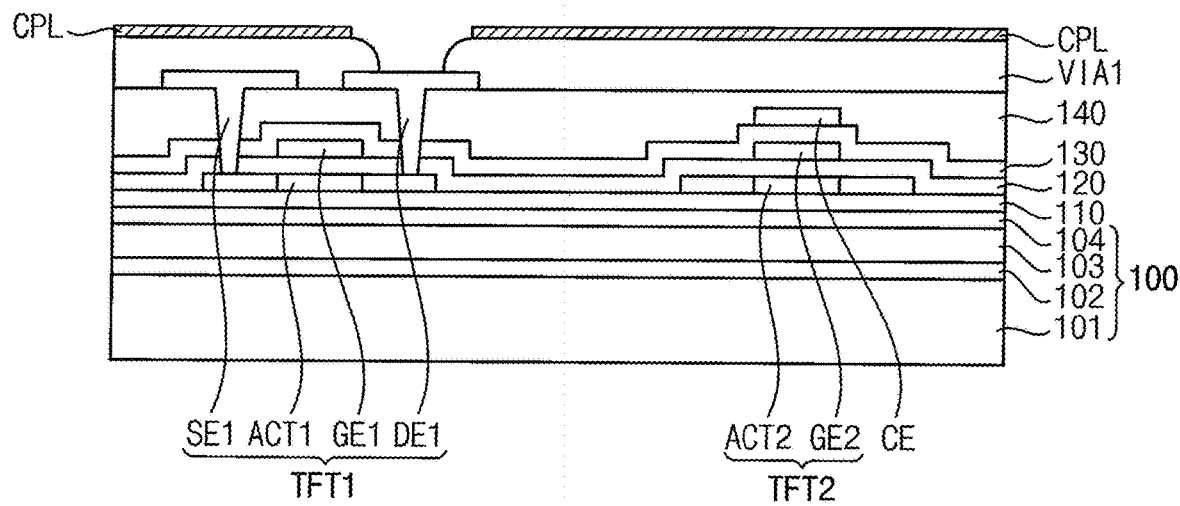

Referring to FIG. 9E, an opening OP exposing the first contact hole CNT1 may be defined in the insulating layer CPL.

Specifically, after forming a photoresist layer on the insulating layer CPLa, the photoresist layer may be exposed and developed using a second mask. And then, the insulating layer CPLa may be etched using the photoresist layer as an etch barrier to form the insulating layer CPL in which the opening is defined.

Figure 9F:
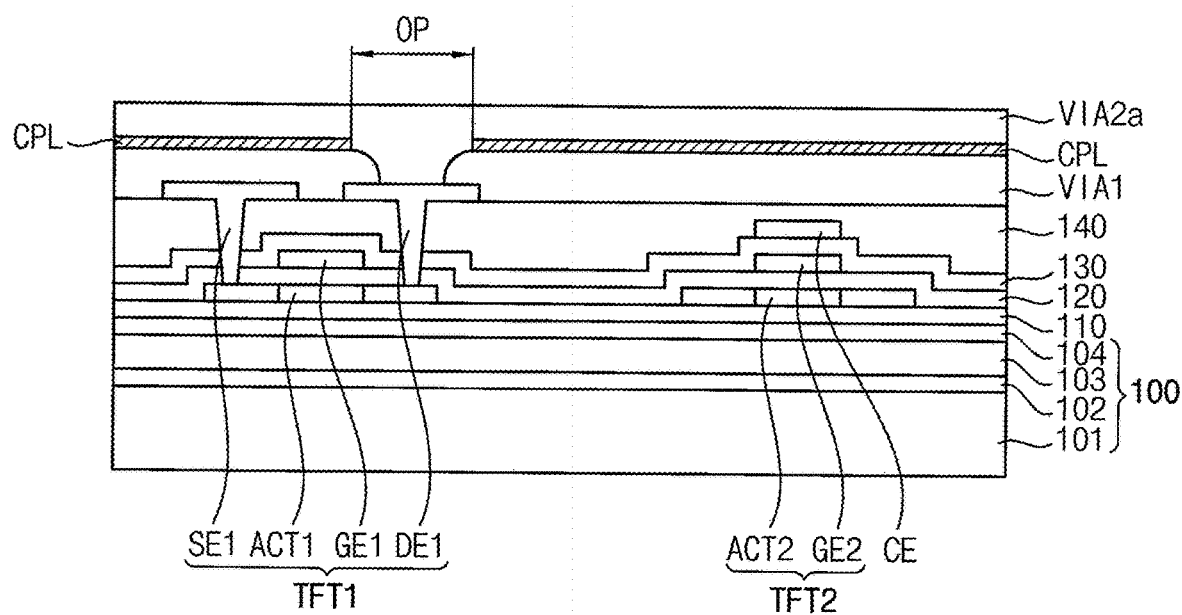

Referring to FIG. 9F, a second organic insulating layer VIA2a may be disposed on the insulating layer CPL and the first organic insulating layer VIA1 in which the opening OP is defined.

Specifically, a second organic insulating layer VIA2a including a photoresist composition may be disposed on the insulating layer CPL and the first organic insulating layer VIA1 in which the opening OP is defined. In an exemplary embodiment, the second organic insulating layer VIA2a may be provided using a spin coating process or the like, for example.

Figure 9G:
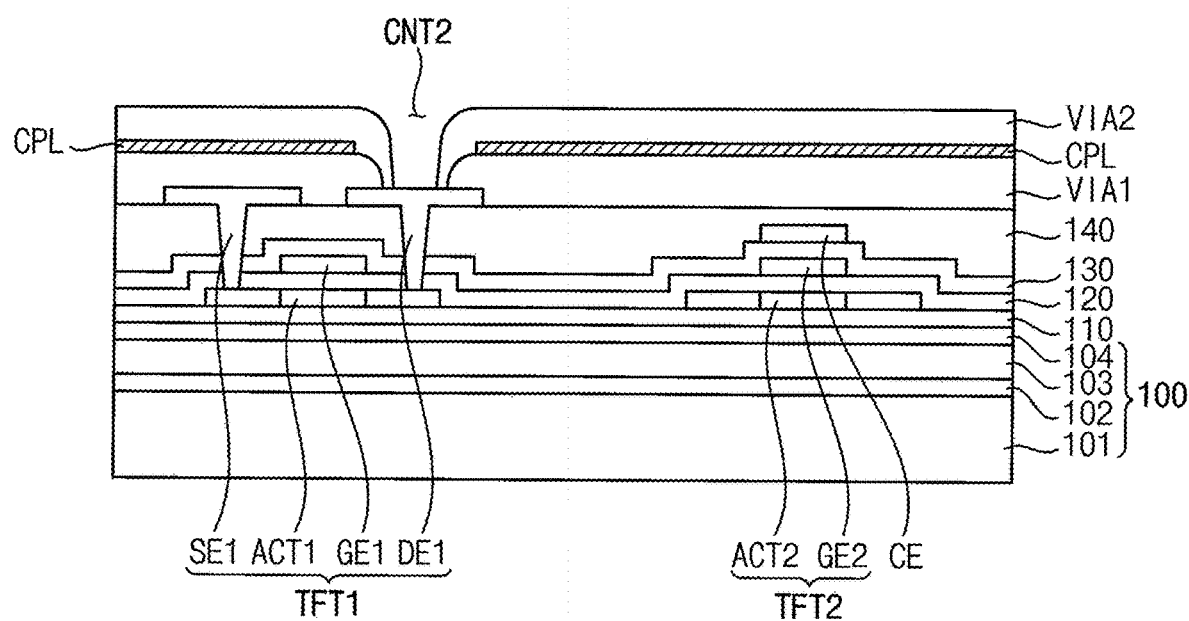

Referring to FIG. 9G, a second contact hole exposing the electrode DE1 may be defined in the second organic insulating layer VIA2.

In detail, the second organic insulating layer VIA2a including the photoresist composition is exposed and developed by a third mask to form the second organic insulating layer VIA2 in which the second contact hole CNT2 is defined. Here, the first mask, the second mask and the third mask may have exposure areas of different sizes. Accordingly, sizes of the first contact hole CNT1, the opening OP, and the second contact hole CNT2 may be different from each other. In an exemplary embodiment, the width of the first contact hole CNT1 may be greater than the width of the second contact hole CNT2, and the width of the opening OP is greater than the width of the first contact hole CNT1, for example.

Figure 9H:
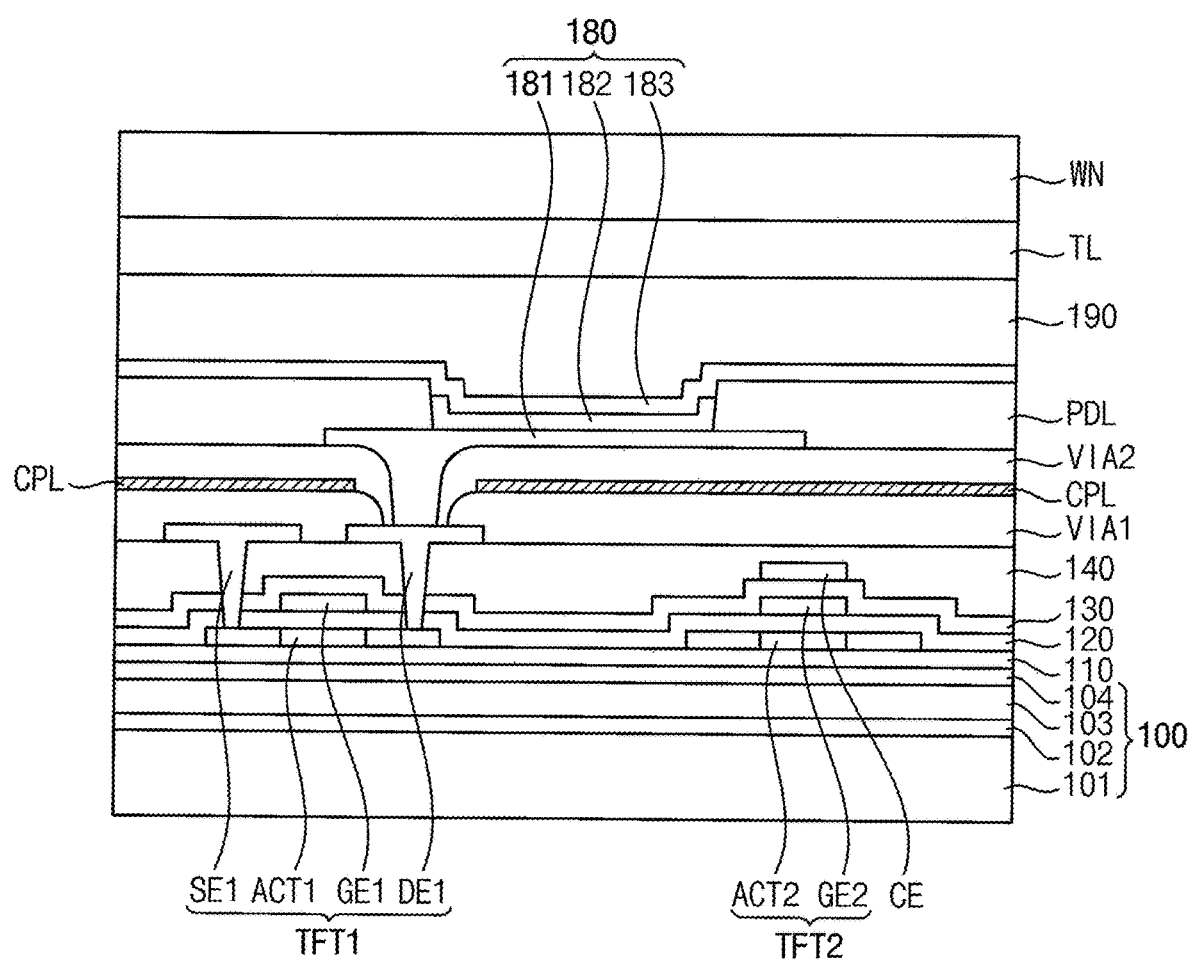

Referring to FIG. 9H, the display apparatus may be manufactured by stacking structures on the second organic insulating layer VIA2.

Specifically, after a first electrode 181, a pixel defining layer PDL, a light emitting layer 182, a second electrode 183, a thin film encapsulation layer 190 and a touch electrode layer TL are disposed on the second organic insulating layer VIA2, the cover window WN may be attached to manufacture the display apparatus. The first electrode 181, the pixel defining layer PDL, the light emitting layer 182, the second electrode 183, the thin film encapsulation layer 190, the touch electrode layer TL, and the cover window WN may be manufactured by various known methods, and a detailed description thereof will be omitted.

Figure 10:
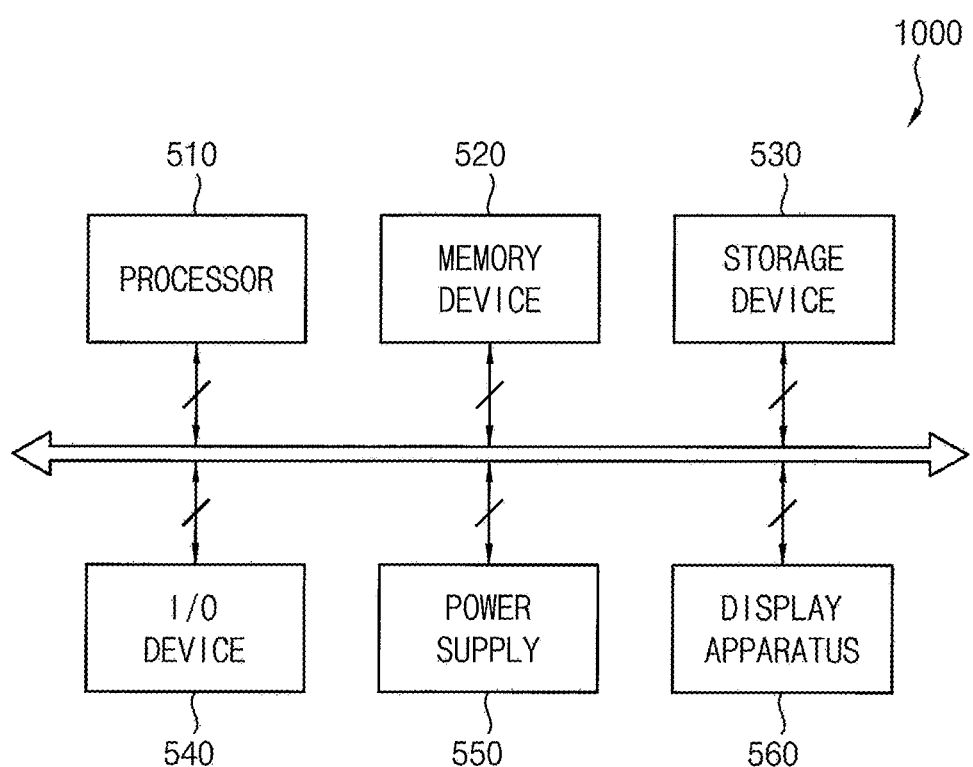
FIG. 10 is a block diagram illustrating an exemplary embodiment of an electronic device.
Figure 11A:
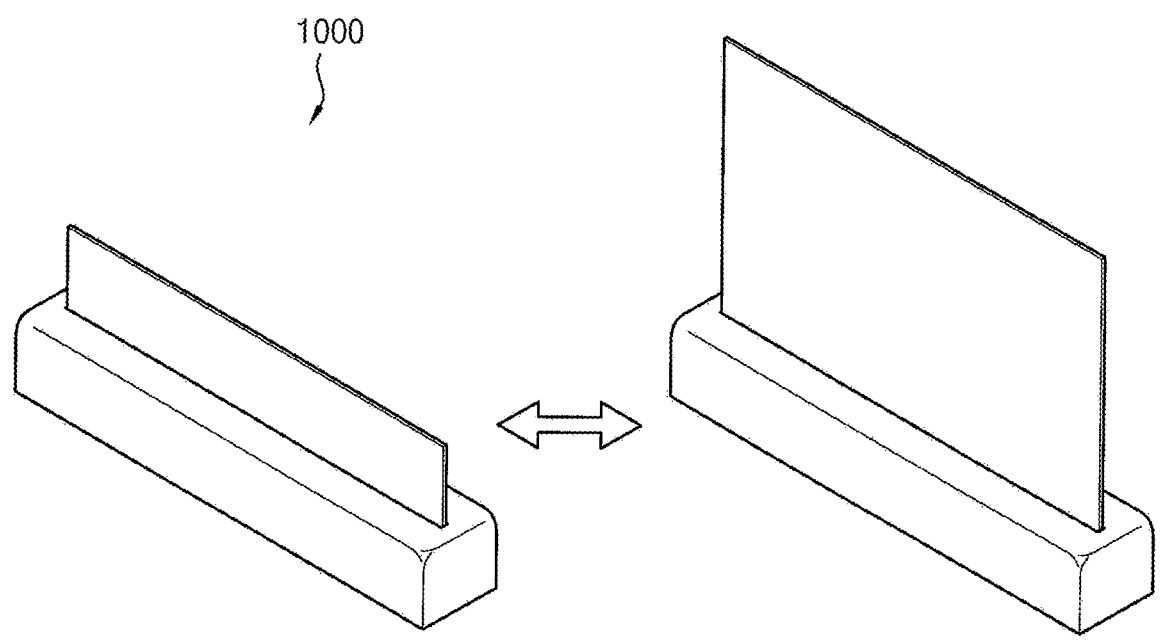
FIG. 11A is a diagram illustrating an example in which the electronic device of FIG. 10 is implemented as a television.
Figure 11B:
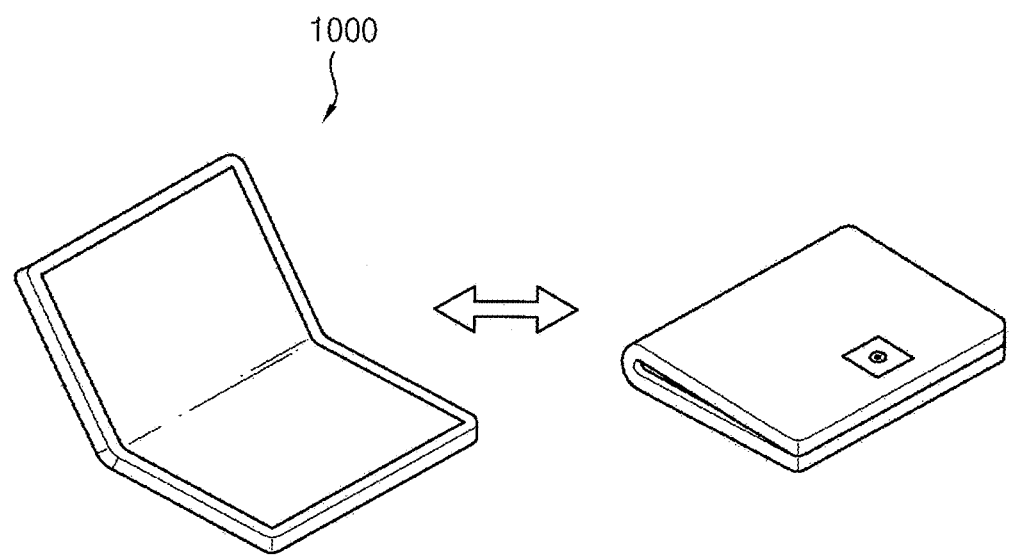
FIG. 11B is a diagram illustrating an example in which the electronic device of FIG. 10 is implemented as a smart phone.

FIG. 10 is a block diagram illustrating an exemplary embodiment of an electronic device. FIG. 11A is a diagram illustrating an example in which the electronic device of FIG. 10 is implemented as a television. FIG. 11B is a diagram illustrating an example in which the electronic device of FIG. 10 is implemented as a smart phone.

Referring to FIGS. 10 through 11B, the electronic device 1000 may include a processor 510, a memory device 520, a storage device 530, an input/output ("I/O") device 540, a power supply 550, and a display apparatus 560. Here, the display apparatus 560 may correspond to the display apparatus of FIG. 1. In addition, the electronic device 1000 may further include a plurality of ports for communicating with a video card, a sound card, a memory card, a universal serial bus ("USB") device, other electronic devices, etc. In an exemplary embodiment, as illustrated in FIG. 11A, the electronic device 1000 may be implemented as a television. In another exemplary embodiment, as illustrated in FIG. 11B, the electronic device 1000 may be implemented as a smart phone. However, the electronic device 1000 is not limited thereto. In an exemplary embodiment, the electronic device 1000 may be implemented as a cellular phone, a video phone, a smart pad, a smart watch, a tablet personal computer ("PC"), a car navigation system, a computer monitor, a laptop, a head mounted display ("HMD"), etc., for example.

The processor 510 may perform various computing functions. The processor 510 may be a microprocessor, a central processing unit ("CPU"), an application processor ("AP"), etc. The processor 510 may be coupled to other components via an address bus, a control bus, a data bus, etc. Further, the processor 510 may be coupled to an extended bus such as a peripheral component interconnection ("PCI") bus. The memory device 520 may store data for operations of the electronic device 1000. In an exemplary embodiment, the memory device 520 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or at least one volatile memory device such as a dynamic random access memory ("DRAM") device, a static random access memory ("SRAM") device, a mobile DRAM device, etc., for example. The storage device 530 may include a solid state drive ("SSD") device, a hard disk drive ("HDD") device, a CD-ROM device, etc. The I/O device 540 may include an input device such as a keyboard, a keypad, a mouse device, a touchpad, a touch-screen, etc., and an output device such as a printer, a speaker, etc. The power supply 550 may provide power for operations of the electronic device 500.

The display apparatus 560 may be coupled to other components via the buses or other communication links. In some exemplary embodiments, the display apparatus 560 may be included in the I/O device 540. As described above, the display apparatus 560 includes a first organic insulating layer, a second organic insulating layer and an insulating layer disposed therebetween. Damage to internal elements may be prevented from external impact. In particular, the display apparatus 560 may be a flexible display apparatus or a collapsible foldable display apparatus. Even when a flexible cover window is used, the display apparatus 560 may effectively prevent damage of an internal element from external impact.

The invention may be applied to organic light emitting display devices and various electronic devices including the same. In an exemplary embodiment, the invention may be applied to a mobile phone, a smart phone, a video phone, a smart pad, a smart watch, a tablet PC, a car navigation system, a television, a computer monitor, a notebook, and the like.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display apparatus, comprising:
    a base substrate;
    a thin film transistor disposed on the base substrate and including an active pattern, a gate electrode, a source electrode, and a drain electrode;
    an inorganic insulating layer disposed between the active pattern and the gate electrode;
    a first organic insulating layer disposed on the thin film transistor;
    a second organic insulating layer disposed on the first organic insulating layer; and
    an insulating layer disposed between the first organic insulating layer and the second organic insulating layer and in direct contact with the first organic insulating layer and the second organic insulating layer,
    wherein the insulating layer does not contact the source electrode or the drain electrode.

2. The display apparatus of claim 1, wherein Young's modulus of the insulating layer is equal to or greater than about 70 gigapascals.

3. The display apparatus of claim 1, wherein Young's modulus of the first organic insulating layer and the second organic insulating layer are equal to or less than about 20 gigapascals.

4. The display apparatus of claim 1, wherein a contact hole exposing the source electrode or the drain electrode is defined through the first organic insulating layer and the second organic insulating layer,
    an opening through which the contact hole passes is defined in the insulating layer.

5. The display apparatus of claim 4, wherein the insulating layer is disposed on an upper surface of the first organic insulating layer.

6. The display apparatus of claim 4, wherein the contact hole includes a first contact hole defined through the first organic insulating layer and a second contact hole defined through the second organic insulating layer,
    an edge of the first organic insulating layer defining the first contact hole is spaced apart from the insulating layer by a first distance in a first direction, and
    a width of the first contact hole is greater than a width of the second contact hole.

7. The display apparatus of claim 4, further comprising:
    a first electrode disposed on the second organic insulating layer and electrically connected to the source or drain electrode of the thin film transistor through the contact hole;
    a light emitting layer disposed on the first electrode; and
    a second electrode disposed on the light emitting layer.

8. The display apparatus of claim 7, further comprising:
a thin film encapsulation layer disposed on the second electrode;
a touch electrode layer disposed on the thin film encapsulation layer; and
a cover window disposed on the touch electrode layer and has flexibility, and
wherein the base substrate is flexible.

9. The display apparatus of claim 1, wherein the first organic insulating layer includes a siloxane-based resin,
the second organic insulating layer includes a polyimide resin, and
the insulating layer includes silicon nitride (SiNx).

10. The display apparatus of claim 1, wherein the insulating layer overlaps the thin film transistor.

11. The display apparatus of claim 1, further comprising:
a third organic insulating layer disposed on the second organic insulating layer; and
a second insulating layer disposed between the second organic insulating layer and the third organic insulating layer and in direct contact with the second organic insulating layer and the third organic insulating layer.

12. A display apparatus, comprising:
a base substrate;
a thin film transistor disposed on the base substrate, and including an active pattern and a gate electrode;
an electrode electrically connected to the thin film transistor;
a gate insulating layer disposed between the active pattern of the thin film transistor and the gate electrode;
a first insulating layer disposed on the thin film transistor and the electrode;
a second insulating layer disposed on the first insulating layer; and
an insulating layer disposed between the first insulating layer and the second insulating layer and in direct contact with the first insulating layer and the second insulating layer, and
wherein Young's modulus of the insulating layer is equal to or greater than about 70 gigapascals, and
wherein the insulating layer does not contact the electrode.

13. The display apparatus of claim 12, wherein the gate insulating layer comprises inorganic insulating material,
the first insulating layer comprises an organic insulating material, and
the second insulating layer comprises an organic insulating material.

14. The display apparatus of claim 13, wherein the insulating layer comprises silicon nitride (SiNx).

15. The display apparatus of claim 12, wherein a contact hole exposing the electrode through the first insulating layer and the second insulating layer is defined, and an opening through which the contact hole passes is defined in the insulating layer.

16. The display apparatus of claim 12, further comprising:
a light emitting structure on the second insulating layer and electrically connected to the thin film transistor;
a thin film encapsulation layer disposed on the light emitting structure;
a touch electrode layer disposed on the thin film encapsulation layer; and
a flexible cover window disposed on the touch electrode layer, and
wherein the base substrate is flexible.

17. A display apparatus, comprising:
a base substrate;
a thin film transistor disposed on the base substrate and including an active pattern, a gate electrode, a source electrode, and a drain electrode;
an inorganic insulating layer disposed between the active pattern and the gate electrode;
a first organic insulating layer disposed on the thin film transistor;
a second organic insulating layer disposed on the first organic insulating layer; and
an insulating layer disposed between the first organic insulating layer and the second organic insulating layer and in direct contact with the first organic insulating layer and the second organic insulating layer,
wherein a contact hole exposing the source electrode or the drain electrode is defined through the first organic insulating layer and the second organic insulating layer,
wherein the contact hole includes a first contact hole defined through the first organic insulating layer and a second contact hole defined through the second organic insulating layer,
an edge of the first organic insulating layer defining the first contact hole is spaced apart from the insulating layer by a first distance in a first direction, and
a width of the first contact hole is greater than a width of the second contact hole.

\* \* \* \* \*